United States Patent
Andrews

(10) Patent No.: US 9,240,526 B2
(45) Date of Patent: Jan. 19, 2016

(54) SOLID STATE LIGHT EMITTING DIODE PACKAGES WITH LEADFRAMES AND CERAMIC MATERIAL

(75) Inventor: Peter S. Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 1217 days.

(21) Appl. No.: 12/766,293

(22) Filed: Apr. 23, 2010

(65) Prior Publication Data

US 2011/0260199 A1    Oct. 27, 2011

(51) Int. Cl.
*H01L 33/48* (2010.01)
*H01L 33/64* (2010.01)
*H01L 33/62* (2010.01)

(52) U.S. Cl.
CPC ............ *H01L 33/486* (2013.01); *H01L 33/641* (2013.01); *H01L 33/62* (2013.01); *H01L 2224/48227* (2013.01); *H01L 2224/48247* (2013.01); *H01L 2933/0033* (2013.01)

(58) Field of Classification Search
CPC .............................. H01L 33/486; H01L 33/641
USPC ............ 257/99, 701, 703, E33.066, E23.066, 257/E23.067; 438/26
See application file for complete search history.

(56) References Cited

U.S. PATENT DOCUMENTS

| | | | |
|---|---|---|---|
| 4,459,166 A | 7/1984 | Dietz et al. | |
| 5,243,133 A | 9/1993 | Engle et al. | |
| 5,381,037 A | 1/1995 | Olivarez | |
| 5,747,877 A * | 5/1998 | Wilson | 257/703 |
| 6,255,740 B1 | 7/2001 | Tsuji et al. | |
| 6,879,034 B1 | 4/2005 | Yang et al. | |
| 7,098,483 B2 * | 8/2006 | Mazzochette et al. | 257/81 |
| 7,528,421 B2 * | 5/2009 | Mazzochette | 257/99 |
| 7,550,319 B2 * | 6/2009 | Wang et al. | 438/125 |
| 7,595,997 B2 * | 9/2009 | Nomiya et al. | 361/742 |
| 7,824,963 B2 * | 11/2010 | Walberg et al. | 438/111 |
| 2002/0171134 A1 | 11/2002 | Choi | |
| 2004/0079957 A1 | 4/2004 | Andrews et al. | |
| 2004/0080386 A1 | 4/2004 | Kitamura et al. | |
| 2004/0126913 A1 | 7/2004 | Loh | |
| 2004/0142511 A1 | 7/2004 | Yamashita et al. | |
| 2004/0219719 A1 | 11/2004 | Yoneda et al. | |
| 2004/0222433 A1 * | 11/2004 | Mazzochette et al. | 257/99 |
| 2005/0139846 A1 * | 6/2005 | Park et al. | 257/98 |

(Continued)

FOREIGN PATENT DOCUMENTS

CN    1925182 A    3/2007
CN    101110462 A    1/2008

(Continued)

OTHER PUBLICATIONS

International Search Report and the Written Opinion of the International Searching Authority Corresponding to International Application No. PCT/US11/32217; Date of Mailing: Jun. 29, 2011; 17 Pages.

(Continued)

*Primary Examiner* — Allan R Wilson

(74) *Attorney, Agent, or Firm* — Myers Bigel Sibley & Sajovec, P.A.

(57) ABSTRACT

Solid state light emitting diode packages can be provided including a ceramic material and a leadframe structure, on the ceramic material, the leadframe structure including a portion thereof that integrates the leadframe structure with the ceramic material.

16 Claims, 12 Drawing Sheets

(56) References Cited

U.S. PATENT DOCUMENTS

| | | |
|---|---|---|
| 2005/0174544 A1 | 8/2005 | Mazzochette |
| 2005/0199884 A1 | 9/2005 | Lee et al. |
| 2005/0199899 A1 | 9/2005 | Lin et al. |
| 2005/0269587 A1 | 12/2005 | Loh et al. |
| 2006/0119250 A1 | 6/2006 | Suehiro et al. |
| 2007/0018175 A1 | 1/2007 | Mazzochette et al. |
| 2007/0057364 A1* | 3/2007 | Wang et al. ............ 257/701 |
| 2007/0138240 A1* | 6/2007 | Djordjevic et al. ........ 228/256 |
| 2007/0257344 A1 | 11/2007 | Chen et al. |
| 2007/0262339 A1 | 11/2007 | Hussell et al. |
| 2008/0012036 A1 | 1/2008 | Loh et al. |
| 2008/0179618 A1 | 7/2008 | Cheng |
| 2008/0303157 A1 | 12/2008 | Cheng et al. |
| 2009/0050908 A1 | 2/2009 | Yuan et al. |
| 2009/0129025 A1 | 5/2009 | Kraus et al. |
| 2009/0152665 A1 | 6/2009 | Tseng et al. |
| 2009/0283781 A1 | 11/2009 | Chan et al. |
| 2009/0315061 A1 | 12/2009 | Andrews |
| 2010/0039044 A1 | 2/2010 | Hatakenaka et al. |
| 2010/0084681 A1 | 4/2010 | Nakajima et al. |
| 2010/0163919 A1 | 7/2010 | Kamamori et al. |
| 2010/0181582 A1* | 7/2010 | Li et al. ............ 257/91 |
| 2010/0232751 A1 | 9/2010 | Biwa et al. |
| 2011/0140154 A1* | 6/2011 | Nakayama et al. ......... 257/98 |

FOREIGN PATENT DOCUMENTS

| | | |
|---|---|---|
| JP | H11-504159 A | 4/1999 |
| JP | 2006-086178 | 3/2006 |
| JP | 2007-049099 | 2/2007 |
| JP | 2007-273591 A | 10/2007 |
| JP | 2009-087965 | 4/2009 |
| JP | 2009-534864 A | 9/2009 |
| WO | WO 96/23321 A1 | 8/1996 |
| WO | WO 2008/105245 A1 | 9/2008 |
| WO | WO 2010/021367 A1 | 2/2010 |

OTHER PUBLICATIONS

Wikipedia, the free encyclopedia, *Low Temperature Co-Fired Ceramic (LTCC)*, http://en.wikipedia.org/wiki/Low_temperature_co-fired_ceramic, accessed Dec. 16, 2009.

siliconfareast.com, *Lead Frames*, www.siliconfareast.com/leadframes, accessed Dec. 16, 2009.

European Search Report Corresponding to European Application No. 11772447.6; Dated: Jul. 7, 2014; 7 Pages.

Japanese Office Action Corresponding to Japanese Patent Application No. 2013-506177; Dispatch Date: Nov. 25, 2013; Foreign Text, 3 Pages, English Translation Thereof, 3 Pages.

Japanese Office Action Corresponding to Japanese Patent Application No. 2013-506177; Dispatch Date: Apr. 27, 2015; Foreign Text, 5 Pages, English Translation Thereof, 6 Pages.

* cited by examiner

SOLID STATE LIGHT EMITTING DIODE PACKAGES WITH LEADFRAMES AND CERAMIC MATERIAL

FIELD OF THE INVENTION

This invention relates to solid state light emitting diodes, and more particularly to packages for solid state light emitting diodes and methods of forming packages for solid state light emitting diodes.

BACKGROUND

It is known to mount solid state light sources, such as semiconductor light emitting diodes (LEDs), in packages that may provide protection, color selection, focusing, and the like, for light emitted by the light emitting diode. A solid state light emitting diode may be, for example, an organic or inorganic light emitting diode. Some packages for light emitting diodes are described in U.S. Pre-grant Publication Nos. 2004/0079957, 2004/0126913, 2005/0269587, and 2008/0012036, which are assigned to the assignee of the present invention, and which are incorporated herein by reference as if set forth fully herein.

According to FIGS. 1A and 1B, a typical leadframe-based LED package 160 includes electrical leads, contacts or traces for electrically connecting the LED package to an external circuit. The package 160 can include a leadframe 102 and a molded package body 130 surrounding the leadframe 102 and a lens 140 mounted over a central region of the leadframe 102. Electrical leads 104, 106 extend from sides of the package body 130. Other optical features, such as reflectors, diffusers, etc., may be provided instead of or in addition to the lens 140.

The package body 130 may be formed of, for example, thermoset and/or a thermoplastic by transfer or injection molding, around the leadframe 102. The thermoplastic may include a liquid crystal polymer such as a Vectra® series polymers A130 and/or S135 available from Ticona Engineering Polymers. Other suitable liquid crystal polymers are available from Solvay Advanced Polymers. Polycarbonate, Lexan® from GE Polymers and/or PPA (polyphthalamide) from Solvay Advanced Polymers may also be used as the thermoplastic for the package body 130.

The package body 130 may expose the bottom surface of the central region of the leadframe 102 and may extend at least partially between lower surfaces 104b, 106b of the leads 104, 106 and a lower surface 102b of the central region of the leadframe 100 while exposing at least a portion of the lower surface 102b of the central region. Further, the package body 130 may have a bottom surface 130b that is coplanar with the bottom surface 102b of the central region of the leadframe 102. When the package 160 is mounted, the exposed surface 102b of the leadframe 102 may be placed into thermal contact with, for example, an external heatsink (not shown).

Other packages, as illustrated in FIG. 2, can include the leadframe 102 supporting a ceramic submount 101 with LEDs 103 thereon. A glass lens 140 can be mounted over the LEDs 103 and a reflector may be provided as part of the package. The LEDs 103 can be electrically connected to the leads 104, 106 by wires 150. Still other packages can include a silicon lens that is injection molded on the submount 101.

SUMMARY

Embodiments according to the invention can provide solid state light emitting diode packages with leadframes and low-temperature co-fired ceramic materials and methods of forming the same. Pursuant to these embodiments, a structure for mounting an electronic device thereon can include a ceramic material and a leadframe structure, on the ceramic material, the leadframe structure including a portion thereof that integrates the leadframe structure with the ceramic material.

In some embodiments according to the invention, the portion of the leadframe structure that integrates the leadframe structure with the ceramic material comprises an electrically conductive via that extends in the leadframe structure into the ceramic material.

In some embodiments according to the invention, the ceramic material comprises a co-fired ceramic material and wherein the portion of the leadframe structure that integrates the leadframe structure with the ceramic material is co-fired with the ceramic material.

In some embodiments according to the invention, the portion of the leadframe structure that integrates the leadframe structure with the ceramic material comprises a lead of the leadframe structure that continuously extends on an upper surface and on a lower opposing surface of the ceramic material.

In some embodiments according to the invention, the ceramic material comprises a low-temperature co-fired ceramic (LTCC) material and wherein the portion of the leadframe structure that integrates the leadframe structure with the LTCC material is co-fired with the LTCC material.

In some embodiments according to the invention, a structure for mounting an LED thereon, includes a ceramic material and a leadframe structure, on the ceramic material. An electrically conductive via extends in the leadframe structure into the ceramic material to integrate the leadframe structure with the ceramic material.

In some embodiments according to the invention, the leadframe structure comprises a first leadframe structure on a first surface of the ceramic material, where the structure can further include an LED on the first leadframe structure and a second leadframe structure on a second surface of the ceramic material opposite the first surface.

In some embodiments according to the invention, the electrically conductive via further extends through the ceramic material to the second leadframe structure.

In some embodiments according to the invention, the leadframe structure is on a first surface of the ceramic material, where the structure can further include an LED on a second surface of the ceramic material that is opposite the first surface.

In some embodiments according to the invention, the ceramic material comprises a first ceramic material on a first surface of the leadframe structure, where the structure can further include an LED on the first ceramic material and a second ceramic material on a second surface of the leadframe structure opposite the first surface.

In some embodiments according to the invention, the electrically conductive via further extends in the first ceramic material through the leadframe structure into the second ceramic material.

In some embodiments according to the invention, a structure for mounting an LED thereon includes a ceramic material and a leadframe structure, on the ceramic material, including a lead of the leadframe structure that continuously extends on first and second opposing surfaces of the ceramic material.

In some embodiments according to the invention, the low-temperature co-fired ceramic material can be a green state ceramic material. In some embodiments according to the invention, the leadframe structure can be a metal. In some embodiments according to the invention, the leadframe structure that is co-fired with the low-temperature co-fired ceramic material can be a mixture of the metal of the leadframe structure and the low-temperature co-fired ceramic material at a junction thereof.

In some embodiments according to the invention, the mixture can be a chemical bonding between constituents of the metal of the leadframe structure and the low-temperature co-fired ceramic material at the junction. In some embodiments according to the invention, the leadframe structure can further include punched-through portions of the leadframe structure that are recessed in the low-temperature co-fired ceramic material.

In some embodiments according to the invention, the punched-through portions are spaced apart from one another by a distance sufficient to compensate for a difference in the temperature coefficients of the low-temperature co-fired ceramic material and the leadframe structure. In some embodiments according to the invention, the punched-through portions are positioned relative to one another to compensate for the difference in the temperature coefficients. In some embodiments according to the invention, the structure can further include a conductive ink on a surface of the low-temperature co-fired ceramic material between, and electrically connecting, spaced apart punched-through portions of the leadframe.

In some embodiments according to the invention, the low-temperature co-fired ceramic material can be a relatively soft state low-temperature co-fired ceramic material, wherein leadframe structure is pressed into a surface of the relatively soft state low-temperature co-fired ceramic material so that at a portion of the leadframe structure is recessed below the surface and a remaining portion protrudes above the surface.

In some embodiments according to the invention, the low-temperature co-fired ceramic material can be a relatively soft state low-temperature co-fired ceramic material, wherein leadframe structure is pressed into a surface of the relatively soft state low-temperature co-fired ceramic material so that at a portion of the leadframe structure is recessed below the surface and a remaining portion protrudes above the surface. In some embodiments according to the invention, the leadframe structure can further include pressed un-punctured portions of the leadframe structure pressed into a surface of the low-temperature co-fired ceramic material.

In some embodiments according to the invention, the leadframe structure and the low-temperature co-fired ceramic material are co-fired at a low temperature of at least about 850 degrees Celsius. In some embodiments according to the invention, the leadframe structure and the low-temperature co-fired ceramic material are co-fired at a high temperature of at least about 1000 degrees Celsius. In some embodiments according to the invention, the leadframe structure is co-fired with the low-temperature co-fired ceramic material to promote heat transfer across a junction of the leadframe structure and the low-temperature co-fired ceramic material and laterally within the leadframe structure.

In some embodiments according to the invention, the leadframe structure includes a roughened surface pressed onto a surface of the low-temperature co-fired ceramic material. In some embodiments according to the invention, the lead frame structure further includes punched-through edge portions of the leadframe structure recessed in the low-temperature co-fired ceramic material separating immediately adjacent lead frame structures.

In some embodiments according to the invention, the leadframe structure can include a first leadframe structure connected to a first surface of the low-temperature co-fired ceramic, where the structure can further include a second leadframe structure connected to a second surface of the low-temperature co-fired ceramic opposite the first surface. In some embodiments according to the invention, the structure can further include a plurality of via holes having electrically conductive material deposited therein extending through the low-temperature co-fired ceramic to connect the first and second leadframe structures.

In some embodiments according to the invention, the leadframe structure is connected to a first surface of the low-temperature co-fired ceramic, where the structure can further include a plurality of via holes having electrically conductive material deposited therein extending through the low-temperature co-fired ceramic from the first surface to an opposing second surface thereof. Further, a plurality of electrically conductive contacts can be connected to the plurality of via holes.

In some embodiments according to the invention, the electronic device comprises a Light Emitting Diode (LED). In some embodiments according to the invention, a portion of the leadframe structure further includes a reflector recess co-located with a recess in a surface of the low-temperature co-fired ceramic.

In some embodiments according to the invention, a Light Emitting diode (LED) can include a low-temperature co-fired ceramic material and a leadframe structure, that is co-fired with the low-temperature co-fired ceramic material. An LED chip is on the leadframe structure and includes a wire bonded to the leadframe.

In some embodiments according to the invention, the LED chip is connected to the leadframe structure without a submount structure therebetween. In some embodiments according to the invention, the LED chip is housed in an encapsulate without inclusion of a plastic package body connected to the leadframe structure.

In some embodiments according to the invention, a method of forming a mounting structure for an electronic device can be provided by applying a leadframe structure to a surface of a low-temperature co-fired ceramic material and co-firing the low-temperature co-fired ceramic material and the leadframe together.

In some embodiments according to the invention, applying a leadframe structure can be provided by pressing the leadframe structure into the surface of the low-temperature co-fired ceramic material. In some embodiments according to the invention, pressing the leadframe structure into the surface can further be provided by punching through the leadframe structure to recess portions of the leadframe in the low-temperature co-fired ceramic material spaced apart from one another by a distance sufficient to compensate for a difference in the temperature coefficients of the low-temperature co-fired ceramic material and the leadframe structure.

In some embodiments according to the invention, the recessed portions are positioned relative to one another to compensate for the difference in the temperature coefficients. In some embodiments according to the invention, the structure can be further provided by applying a conductive ink to the surface of the low-temperature co-fired ceramic material between, and electrically connecting, the spaced apart portions of the leadframe.

In some embodiments according to the invention, the low-temperature co-fired ceramic material can be a relatively soft state low-temperature co-fired ceramic material, where pressing the leadframe structure into the surface can further be provided by pressing the leadframe structure into the surface of the relatively soft state low-temperature co-fired ceramic material so that at a portion of the leadframe structure is recessed below the surface and a remaining portion protrudes above the surface.

In some embodiments according to the invention, pressing the leadframe structure into the surface can further be provided by pressing un-punctured portions of the leadframe structure into the surface of the low-temperature co-fired ceramic material. In some embodiments according to the invention, co-firing can be further provided by co-firing the leadframe structure and the low-temperature co-fired ceramic material at a low temperature of at least about 850 degrees Celsius.

In some embodiments according to the invention, co-firing can be further provided by co-firing the leadframe structure and the low-temperature co-fired ceramic material at a high temperature of about 1000 degrees Celsius. In some embodiments according to the invention, co-firing further can be provided by co-firing the leadframe structure and the low-temperature co-fired ceramic material at a temperature less than about 850 degrees Celsius.

In some embodiments according to the invention, co-firing can be further provided by co-firing the leadframe structure and the low-temperature co-fired ceramic material at a temperature greater than about 1000 degrees Celsius. In some embodiments according to the invention, the low-temperature co-fired ceramic material comprises a ceramic slurry. In some embodiments according to the invention, the low-temperature co-fired ceramic material can be a ceramic wet paste.

In some embodiments according to the invention, a method of forming a mounting structure for an electronic device can be provided by applying a leadframe structure to a surface of a low-temperature co-fired ceramic material and co-firing the low-temperature co-fired ceramic material and the leadframe together. In some embodiments according to the invention, a method of forming a Light Emitting diode (LED) can be provided by mounting an LED on a structure comprising a low-temperature co-fired ceramic material co-fired with an LED leadframe structure and bonding a wire from the LED leadframe structure to a terminal of the LED. An encapsulant can be formed over the LED.

DETAILED DESCRIPTION OF EMBODIMENTS

Figure 1A:
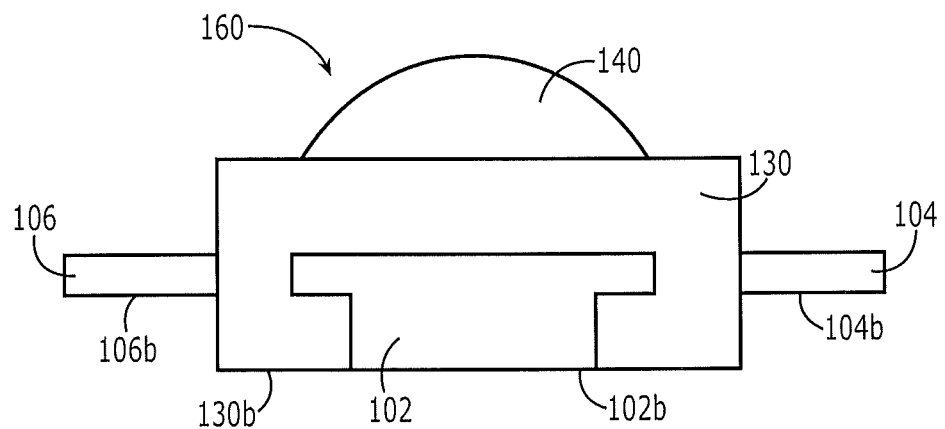
FIGS. 1A & 1B are cross sectional views of a conventional LED package.
Figure 1B:
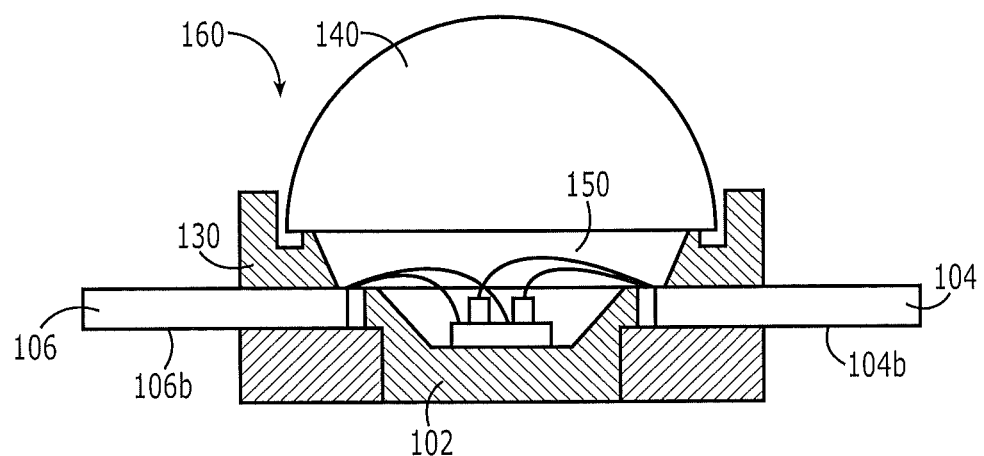

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

As used herein, the term semiconductor light emitting diode may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green light emitting diodes ("LEDs") may be provided. Red and/or amber LEDs may also be provided. The design and fabrication of semiconductor light emitting diodes are well known to those having skill in the art and need not be described in detail herein.

The semiconductor light emitting diodes packaged in accordance with embodiments of the invention may be gallium nitride-based LEDs or lasers fabricated on a silicon carbide substrate such as those devices manufactured and sold by Cree, Inc. of Durham, N.C. Semiconductor light emitting diodes packaged in accordance with embodiments of the invention, can be configured, for example, as shown in FIGS. 3-6.

Figure 3:
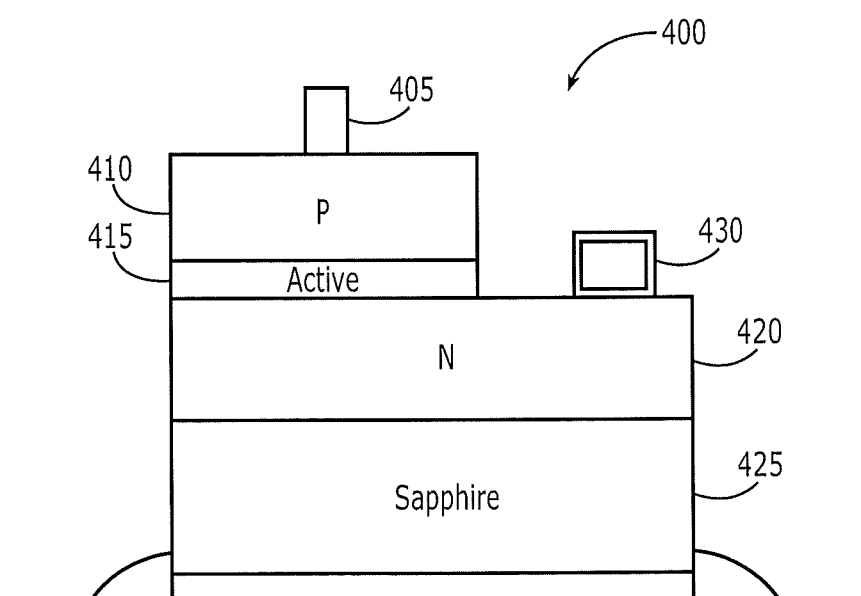
FIGS. 3-6 are illustrations of various LEDs arrangements that can be practiced with embodiments according to the invention.
Figure 4:
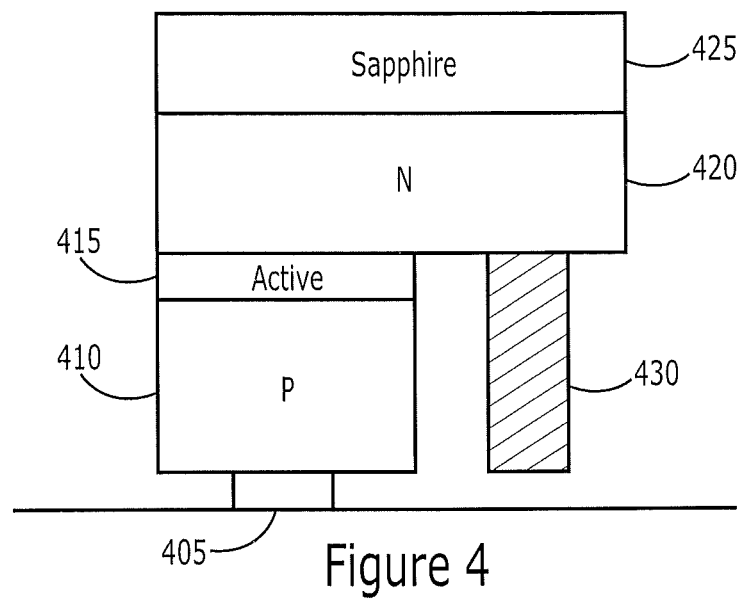

In particular, FIG. 3 illustrates what is sometimes referred to as a two-topside contact horizontal or lateral LED 400, including a first contact 405 on a P-type region 410 formed on an active region 415. The active region 415 is located on an N-type region 420 which includes a second contact 430 thereon that is laterally spaced apart from the first contact 405. The N-type region 420 can be located on a sapphire material 425. In some embodiments, as illustrated in FIG. 4, the arrangement in FIG. 3 can be inverted, so that the contacts are face-down.

Figure 5:
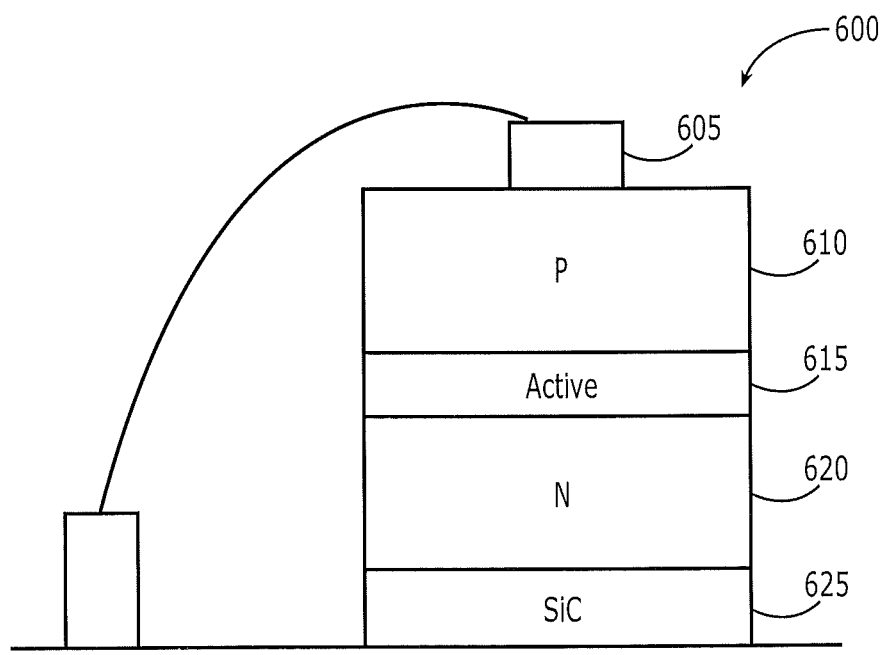

FIG. 5 illustrates what is sometimes referred to as a one-topside contact vertical LED 600, including a first contact 605 on a P-type region 610 formed on an active region 615. The active region 615 is located on an N-type region 620, all of which is on a silicon carbide substrate 625, which can be mounted in a cavity in a device.

Figure 6:
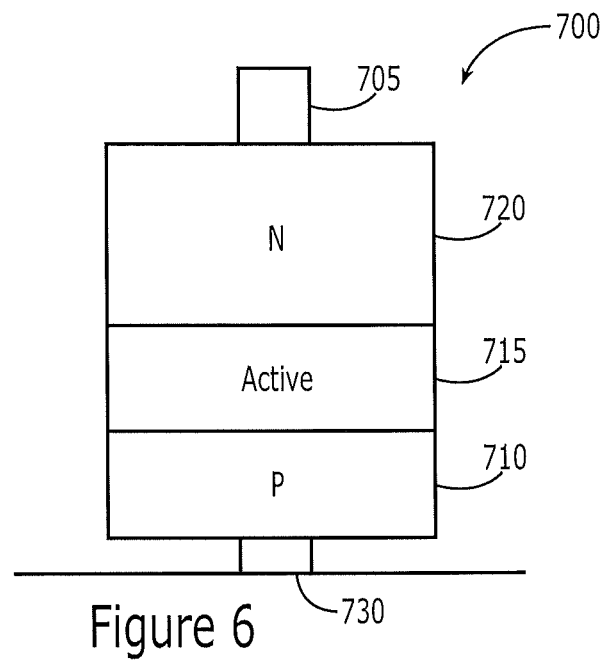

FIG. 6 illustrates what is sometimes referred to as a flip-chip LED 700 configuration with the P region 710 facing down. A lower contact 730 is located below the P-type region 710 and an active region 715 is formed above. An N-type region 720 is on the active region 715, which has an upper contact 705 thereon.

As used herein, the term "ceramic" includes inorganic crystalline oxide materials, such as oxides including alumina, zirconia, etc., non-oxides including carbides, borides, nitrides, silicides etc., and composites of oxides and non-oxides. For example, the ceramic material can be $Al_2O_3$, AlN, ZnO, or the like. This listing provides examples of materials which can be used in some embodiments according to the invention and is not as an exhaustive list of such ceramic materials. The term "ceramic" is not intended to include plastic or thermoset materials.

As described herein, various embodiments according to the invention can provide a structure for mounting an LED thereon which can include a leadframe on a ceramic material, where the leadframe structure includes a portion that allows the ceramic material and the leadframe structure to be integrated with one another. For example, in some embodiments according to the invention, an electrically conductive via in the leadframe structure extends into the ceramic material to provide the integration.

In some embodiments according to the invention, the leadframe structure extends on both an upper surface and on an opposing lower surface of the ceramic material to provide the integration. In still further embodiments according to the invention, the integration can be provided by using a co-fired ceramic as the ceramic material which is co-fired with the leadframe structure so that, for example, the constituent materials of the leadframe structure and the co-fired ceramic can mix with one another. In some according to the invention, the ceramic material can be a low temperature co-fired ceramic (LTCC) material.

Figure 7:
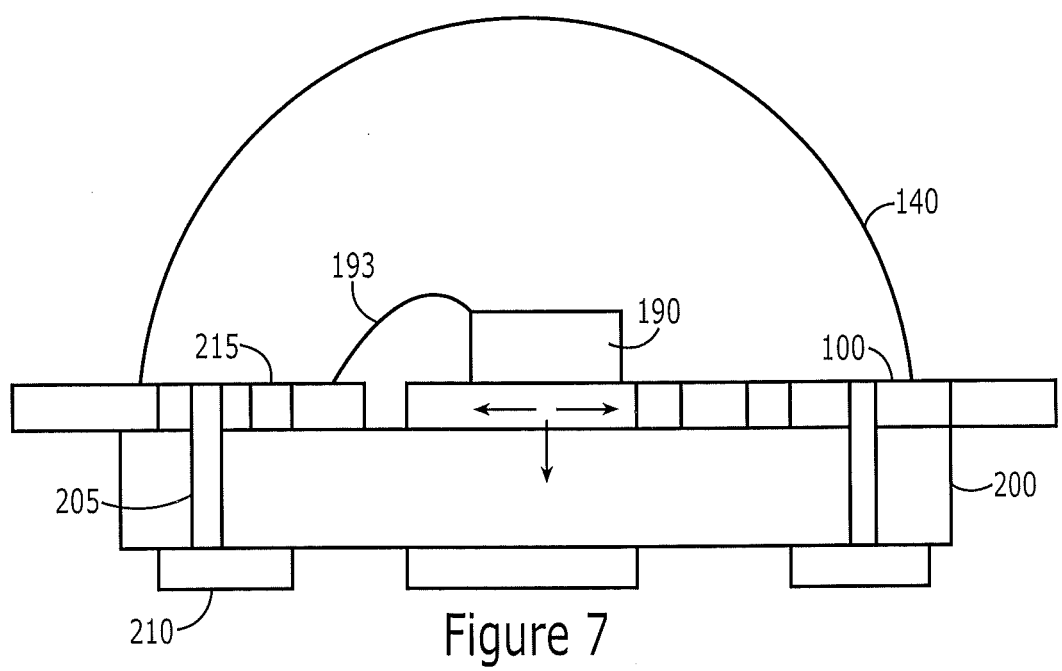
FIG. 7 is a cross sectional view of an LED package including a ceramic material integrated with a leadframe structure in some embodiments according to the invention.

FIG. 7 is a cross sectional view of an LED package including a ceramic material 200 with a leadframe structure 100 thereon in some embodiments according to the invention. In particular, an LED 190 is located on an upper surface of a leadframe structure 100 and includes wires 193 which are bonded to a portion of the leadframe structure 100. The LED package further includes features 215 which can promote adhesion between the leadframe structure 100 and the underlying ceramic material 200.

An opposite side of the ceramic material 200 includes a number of conductive contacts 210 formed thereon and electrically connected to vias 205 extending through the ceramic material 200 to electrically contact the leadframe structure 100. It will be understood that the vias 205 are filled with an electrically conductive material to provide electrical conductivity between the leadframe structure 100 and the contacts 210. Still further, the conductive material in the vias 205 and the contacts 210 can be formed by, for example, an electroplating process. It will be understood that the vias 205 can integrate the leadframe structure 100 with the underlying ceramic material 200 to promote the adhesion therebetween, in addition to the adhesion provided by the features 215.

It will be understood the leadframe structure 100 can be a metal structure which provides a framework to which the wire 193 can be connected so that signals can be provided to the LED 190 and to connect to the vias 205 that extend into the ceramic material 200. The leadframe structure 100 can provide mechanical support to the LED 190 during assembly of the LED package. It will be understood the leadframe structure 100 can be made from a metal such as gold, silver, or the like. The integration of the ceramic material 200 with the leadframe structure 100 can promote heat transfer away from the LED 190 into the leadframe 100 to the ceramic material 200 and laterally within the structures and materials themselves, as illustrated by the arrows in FIG. 7.

Figure 8:
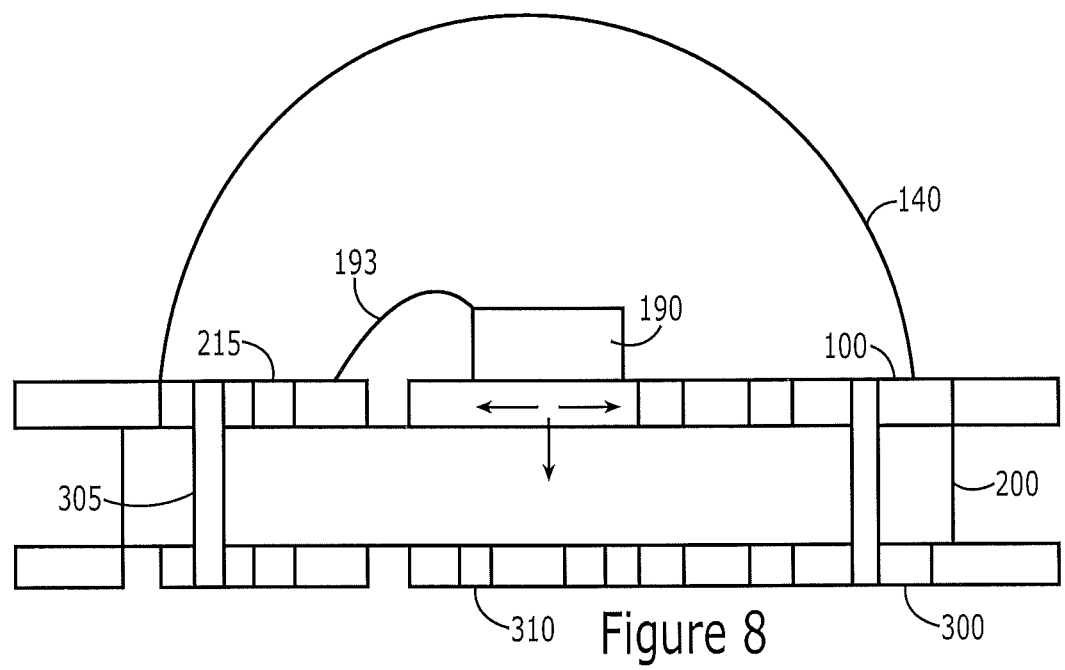
FIG. 8 is a cross sectional view of an LED package including first and second leadframe structures integrated with a ceramic material sandwiched therebetween in some embodiments according to the invention.

FIG. 8 is a cross sectional view of an LED package including first and second leadframe structures 100, 300 and a ceramic material 200 sandwiched therebetween in some embodiments according to the invention. In particular, the first leadframe structure 100 is formed on an upper surface of the ceramic material 200 as described above in reference to FIG. 7. A second leadframe structure 300 is formed on an opposing surface of the ceramic material 200 opposite the first leadframe structure 100.

The second leadframe structure 300 includes features 310 which promote adhesion of the second leadframe structure 300 to the lower surface of the ceramic material 200 in a position to receive electrically conductive vias 305, which are filled with a conductive material. It will be understood that the LED package further includes the features 215 which can also promote adhesion between the leadframe structure 100 and the underlying ceramic material 200.

As shown in FIG. 8, the vias 305 extend through the ceramic material 200 from the first leadframe structure 100 to the second leadframe structure 300 so that the two leadframe structures can be electrically connected to one another as well as to the ceramic material 200.

It will be understood that the vias 305 can provide integration of and promote the adhesion between the leadframe structures 100, 300 and the sandwiched ceramic material 200, in addition to the adhesion provided by the features 215. The integration of the ceramic material 200 with the leadframe structures 100, 300 can promote heat transfer away from the LED 190 into the leadframe 100 to the ceramic material 200 and the leadframe structure 300 and laterally within the structures and materials themselves, as illustrated by the arrows in FIG. 8.

Figure 9:
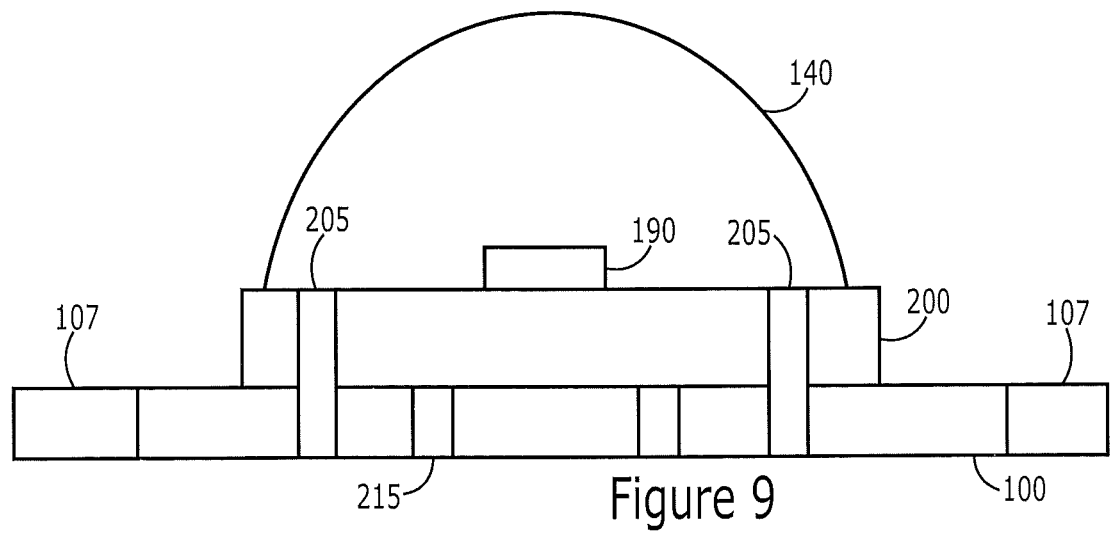
FIG. 9 is a cross sectional view of an LED package including a leadframe structure integrated with a ceramic material in some embodiments according to the invention.

FIG. 9 is a cross-sectional view of an LED package including a ceramic material 200 on a leadframe structure 100 in some embodiments according to the invention. In particular, the leadframe structure 100 is mounted to a lower surface of a ceramic material 200 and the LED 190 is mounted to an upper surface of the ceramic material 200 which is opposite to the lower surface of the ceramic material 200. Further, electrically conductive vias 205 extend in the leadframe structure 205 into the ceramic material 200, which can provide integration of and promote the adhesion between the ceramic material 200 and the leadframe structure 100. Further, features 215 in the leadframe structure 100 can also promote the adhesion between the ceramic material 200 and the leadframe structure 100. The leadframe structure 100 includes leads 107 which extend laterally from the leadframe structure 100, a portion of which can be covered by the ceramic material 200. The integration of the ceramic material 200 with the leadframe structure 100 can promote heat transfer away from the LED 190 into the ceramic material 200 to the leadframe structure 100 and laterally within the structures and materials themselves, as illustrated by the arrows in FIG. 9.

Figure 10:
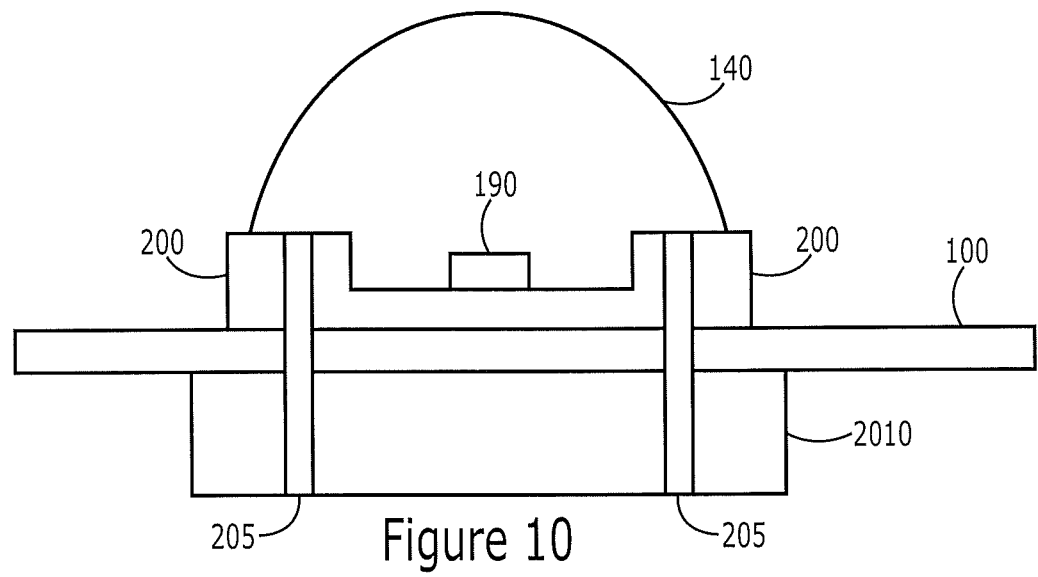
FIG. 10 is a cross sectional view of an LED package including first and second ceramic materials integrated with a leadframe structure sandwiched therebetween in some embodiments according to the invention.

FIG. 10 is a cross-sectional view of an LED package including upper and lower ceramic materials 200, 201 and a leadframe structure 100 sandwiched therebetween in some embodiments according to the invention. In particular, the upper ceramic material 200 is mounted on an upper surface of the leadframe structure 100 and includes a cavity at a central region thereof. As shown in FIG. 10, the LED 190 can be positioned at the central portion of the upper ceramic material 200. The lower ceramic material 201 is mounted on a lower surface of the leadframe structure 100 that is opposite to the upper surface. Electrically conductive vias 205 extend in each of the upper and lower ceramic materials 200, 201 and into the leadframe structure 100, which can provide integration of and promote the adhesion between the ceramic materials 200, 201 and the leadframe structure 100 sandwiched therebetween. The integration of the ceramic materials 200, 201 with the leadframe structure 100 can promote heat transfer away from the LED 190 into the ceramic material 200 to the leadframe structure 100 and ceramic material 201 and laterally within the structures and materials themselves, as illustrated by the arrows in FIG. 10.

Figure 11:
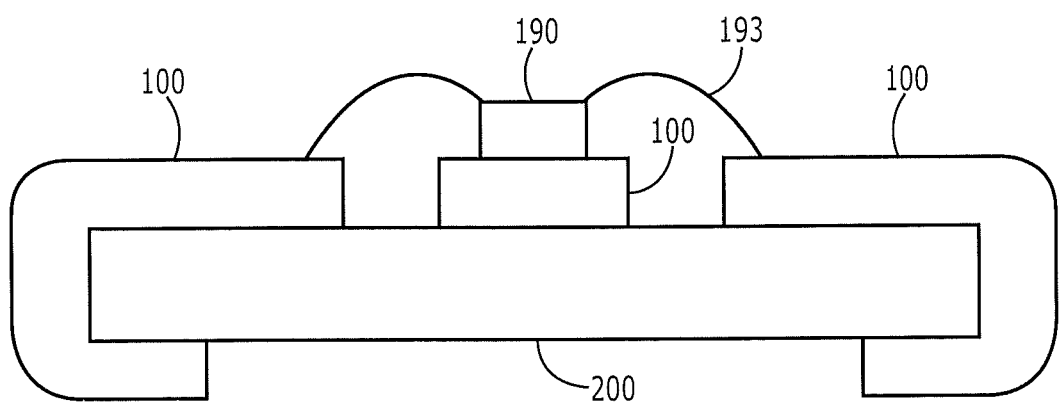
FIG. 11 is a cross sectional view of an LED package including a ceramic material integrated with a leadframe structure in some embodiments according to the invention.
Figure 12:
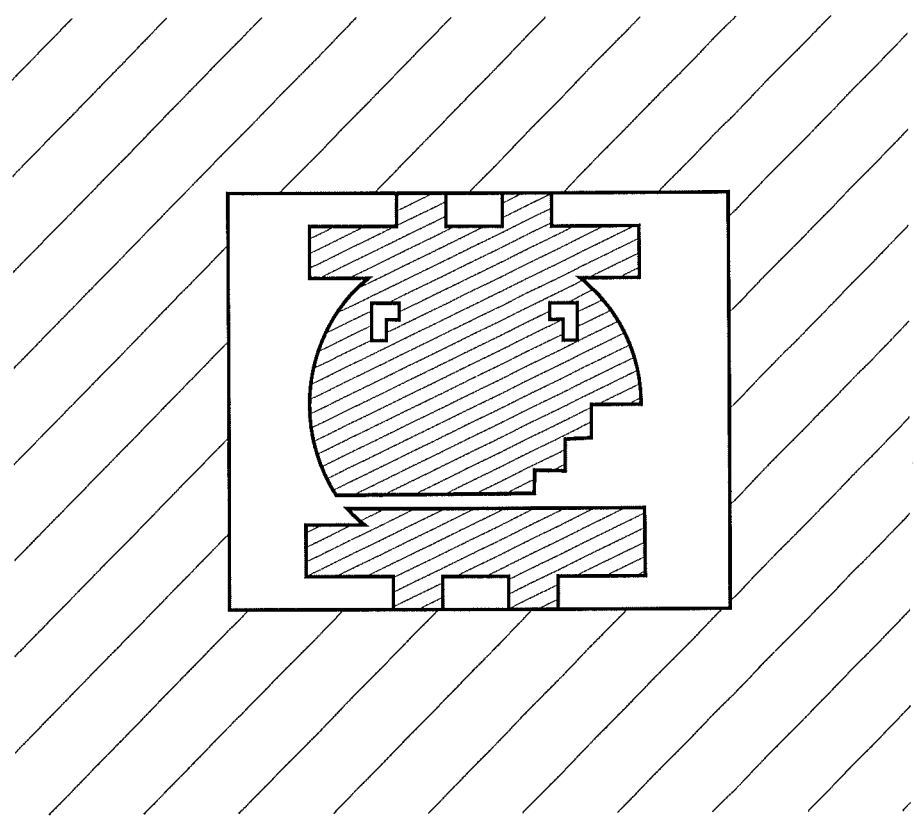
FIG. 12 is a plan view of a leadframe structure which can be utilized in any of the embodiments according to the invention.

FIG. 11 is a cross-sectional view of an LED package including a leadframe structure 100 extending on both an upper surface and on an opposing lower surface of a ceramic material 200 in some embodiments according to the invention. According to FIG. 11, the leadframe structure 100 extends on a central portion of the ceramic material 200 and on outer portions of the upper surface thereof to continuously extend on the sides of the ceramic material 200 as well as on the lower surface of the ceramic material 200 that is opposite from the upper surface thereof. Furthermore, the LED 190 is mounted on a central portion of the leadframe structure 100 and includes wires 193 that connect the LED 190 to portions of the leadframe structure 100. Accordingly, the ceramic material 200 and the leadframe structure are integrated and adhered to one another by the extension of the leadframe structure 100 continuously on both the opposing upper and lower surfaces of the ceramic material 200. The integration of the ceramic material 200 with the leadframe structure 100 can promote heat transfer away from the LED 190 into the leadframe 100 to the ceramic material 200 and laterally within the structures and materials themselves, as illustrated by the arrows in FIG. 11. FIG. 12 is a plan view of an alternative embodiment of a leadframe structure 100 which can be used in any of the embodiments described herein.

In some embodiments according to the invention, the ceramic material 200 described herein, including that described in reference to FIGS. 7-11, can be a low temperature co-fired ceramic (LTCC) material. The LTCC material can be provided in what is sometimes referred to as green state ceramic tape formed of the ceramic materials described herein, such as $Al_2O_3$, AlN, ZnO, or the like. In the green state, the LTCC material can be malleable, so as to be pressmolded into various shapes. The leadframe structure 100 can be, for example, pressed into an upper surface of the LTCC material 200, and then co-fired together. The co-firing of the leadframe structure 100 and the LTCC material 200, can cause constituent elements that comprise the leadframe structure 100 and the LTCC material 200 to mix with one another at, for example, a junction thereof so that the leadframe structure 100 and the LTCC material 200 become integrated. In some embodiments, the co-firing promotes chemical or covalent bonding of the materials therein to one another.

In such embodiments, the LTCC material and the leadframe structure 100 can be co-fired with one another. For example, in some embodiments according to the invention, the LTCC material 200 and the leadframe structure 100 are pressed together and heated together so that constituent elements of the LTCC material 200 and the leadframe structure 100 become integrated by mixing with one another.

In some embodiments according to the present invention, the LTCC material 200 and the leadframe structure 100 are co-fired at a temperature less than 1000° C. In still other embodiments according to the invention, the LTCC material 200 and the leadframe structure 100 are co-fired at a temperature greater than 850° C. but less than 1000° C. It will be understood, that in some embodiments, the LTCC material 200 and the leadframe structure 100 are co-fired at a temperature that is less than 850° C. but may be heated for more time to allow for adequate co-firing. In some embodiments, the LTCC material 200 and the leadframe structure 100 are co-fired at a temperature that is greater than 1000° C., but may be heated for less time to allow for adequate co-firing. It will be understood that any of the embodiments described herein in reference to FIGS. 3-20 can heated for co-firing at the temperatures described above.

In other embodiments according to the invention, when the LTCC material 200 and the leadframe structure 100 are co-fired at a particular temperature, one or more additional sources of energy may be provided to promote sufficient co-firing of the LTCC material 200 and the leadframe structure so that the constituent materials become integrated with one another. For example, the co-firing of the LTCC material 200 and the leadframe structure may be performed under pressure. In some embodiments, ultrasonic energy may be used to provide additional energy to promote sufficient co-firing of the LTCC material 200 and the leadframe structure. Accordingly, in some embodiments, if the LTCC material 200 and the leadframe structure 100 are co-fired at, for example, less than 850° C., one or more additional sources of energy may be provided to promote sufficient co-firing of the LTCC material 200 and the leadframe structure 100 so that the constituent materials become integrated with one another. It will be understood that any of the embodiments described herein in reference to FIGS. 3-20 can be heated for co-firing at the temperatures described above in conjunction with one or more additional sources of energy as described above.

Figure 2:
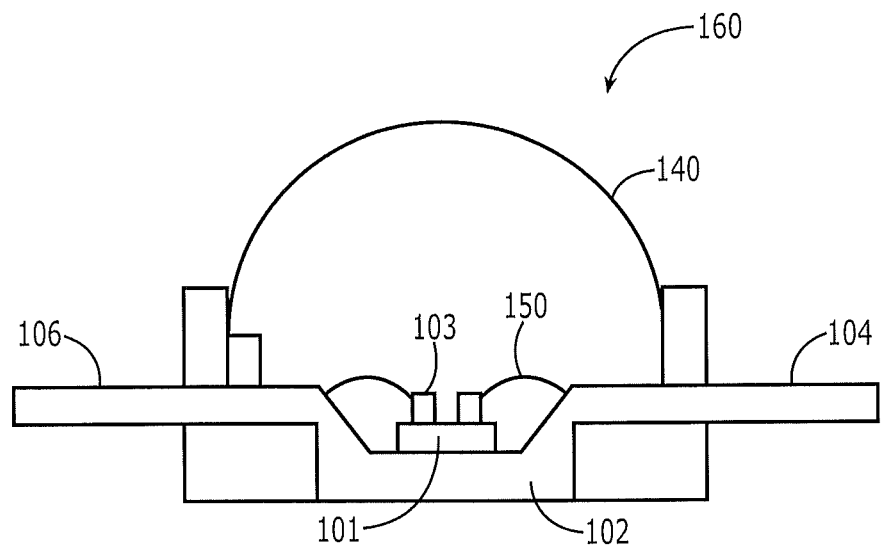
FIG. 2 is cross sectional view of a conventional LED package including a ceramic submount.

After co-firing of the leadframe structure 100 and the LTCC material 200, pathways can be provided within the co-fired leadframe structure 100 and the LTCC material 200 to promote heat transfer away from the LED 190. For example, as shown in FIG. 2, the conduction of heat can be promoted away from the LED device 190 towards and across a junction of the leadframe structure 100 and the LTCC material 200 as well as laterally within the leadframe structure 100 itself. It will be understood that although FIG. 2 shows discrete pathways for heat conduction, many pathways are provided.

The LTCC material 200 can also be punched, cut, and/or drilled to form the electrically conductive vias or other features therein. The LTCC material 200 can provide mechanical support for the LED 190 and the leadframe structure 100 during assembly of the LED package and may include features that provide electrical connections such as die attach pads, electrical traces, as well as features that promote the dissipation of thermal energy, and features that promote optical functionality, such as reflectors and/or lenses, and/or other functionality.

The vias can be plated and/or filled with conductive material, and the LTCC material 200, the leadframe structure (as well as the vias) can be co-fired to transform the LTCC material 200 into a hardened state. As described above, the contacts 210 are electrically connected to the vias 205, which can be formed by, for example, plating and patterning metal traces.

Figure 13A:
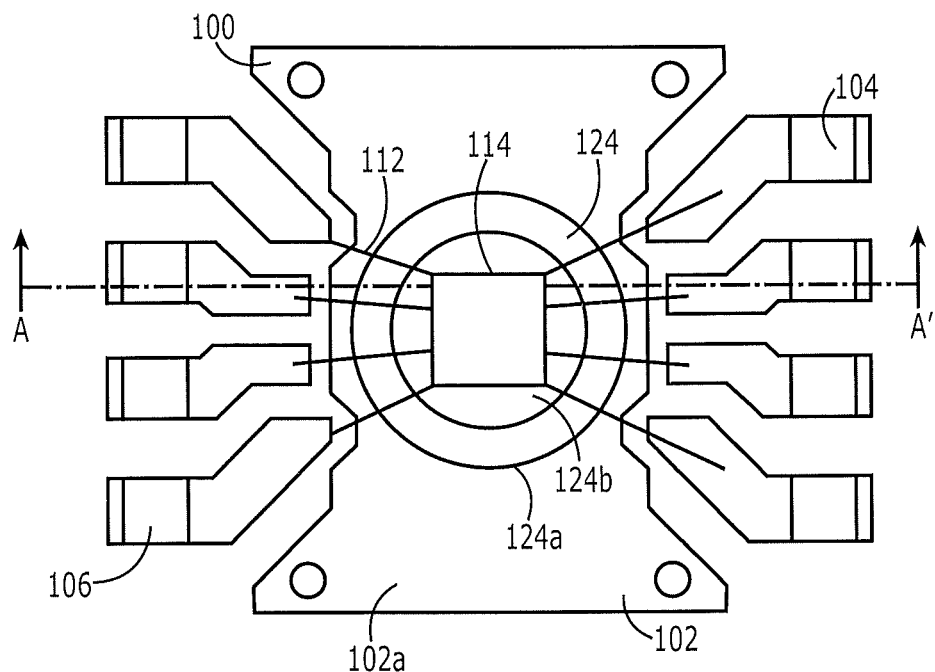
FIG. 13A is a plan view of an LED package including a leadframe co-fired with a co-fired ceramic material in some embodiments according to the invention.
Figure 13B:
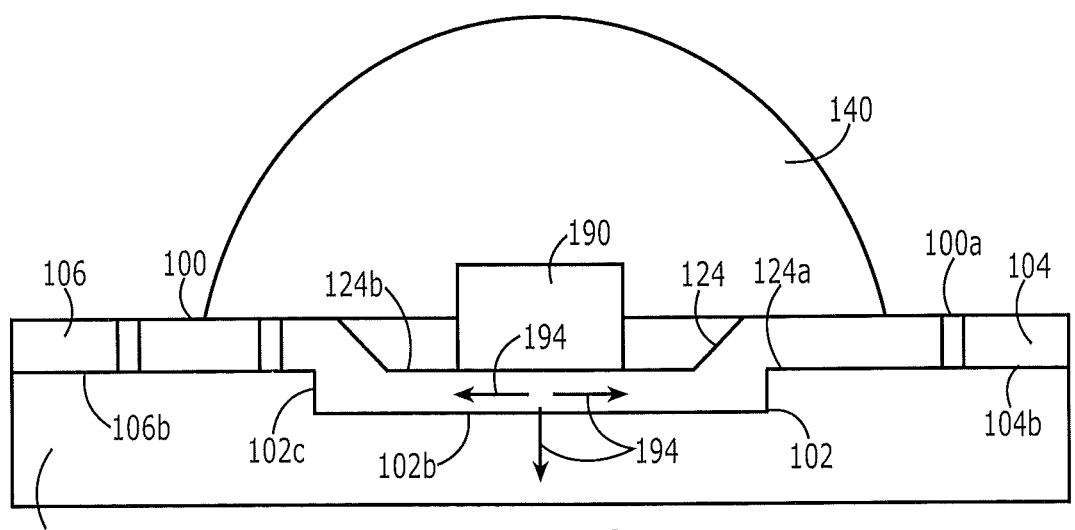
FIG. 13B is a cross sectional view of the LED package including the leadframe co-fired with the co-fired ceramic material illustrated in FIG. 13A in some embodiments according to the invention.

FIGS. 13A and 13B illustrate a plan view of the leadframe structure 100 and a cross sectional view taken along line A-A' of FIG. 13A, respectively highlighting the use of the LTCC material as the ceramic material 200 in some embodiments. The leadframe structure 100 includes the central region 102 and the plurality of leads 104, 106 extending away from the central region 102. The electrical leads 104, 106 may be electrically isolated from one another and/or from the central region 102 of the leadframe structure 100. The leads may be arranged such that leads of opposite polarity type (e.g. anodes or cathodes) are provided on opposite sides of the leadframe structure 100. In some embodiments according to the invention, the electrical leads 104, 106 can have the same thickness. In some embodiments according to the invention, the electrical leads 104, 106 can have different thicknesses.

As shown in FIG. 13A, the leadframe structure 100 further has an upper surface 100a. The central region 102 of the leadframe structure 100 has a substantially flat lower surface 102b that is spaced apart from lower surfaces 104b, 104c of the leads 104, 106 by sidewalls 102c. The central region 102 has a first thickness (i.e. the distance between the upper surface 100a of the leadframe structure 100 and the lower surface 102b of the central region 102), and the electrical leads 104, 106 have a second thickness (i.e. the distance between the upper surface 100a of the leadframe structure 100 and the lower surface 104b, 106b of the respective leads 104, 106) that is less than the first thickness.

A cavity 120 is formed in the central region 102. In some embodiments according to the invention, the cavity 124 includes an oblique sidewall that extends from the upper surface 100a of the leadframe structure 100 to a base 124b located within the central region 102. The cavity 124 may have an arbitrary peripheral shape. However, in the embodiments illustrated in FIGS. 13A and 13B, the cavity 124 has a generally circular peripheral shape. Thus, the oblique sidewall of the cavity 124 may form a generally circular upper lip 124a where the cavity 124 intersects the upper surface 100a of the leadframe structure 100. The sidewall of the cavity 124 shown in FIGS. 13A-B has the shape of a conic section (e.g. a frustum). However, the sidewall of the cavity 124 may form other shapes, for example, a solid parabolic section. In some embodiments according to the invention, the sidewall of the cavity 120 is substantially vertical rather than oblique as shown in FIG. 13B. In some embodiments according to the invention, the cavity 124 includes at least one reflective surface.

The base 124b of the cavity 124 has a diameter that is less than a width of the central region 102 (i.e. a distance between the sidewalls 102c of the central region 102). Furthermore, the upper lip 124a of the cavity 124 has a diameter that may be less than or equal to the width of the central region 102. Moreover, the thickness of the central region 102 between the base 124b of the cavity 124 and the lower surface 102b of the central region 102 may be thicker than electrical leads 104, 106. The LED 190 is located in the central region 102 on the cavity base 124b and includes a terminal wire bonded to leads of the leadframe structure 100.

As illustrated in FIG. 13B, the leadframe structure 100 is located on, and is co-fired with the LTCC material 200, which changes from a relatively soft state to hardened state after co-firing. The combined leadframe structure 100 and LTCC material 200 promotes the transfer of heat away from the LED 190 via pathways 194 (toward the junction of the leadframe structure 100 and LTCC material 200) and toward the outer edges of the leadframe structure 100. The co-firing of the leadframe structure 100 and the LTCC material 200, can cause constituent elements that comprise the leadframe structure 100 and the LTCC material 200 to mix with one another at, for example, a junction thereof so that the leadframe structure 100 and the LTCC material 200 become integrated.

Figure 14:
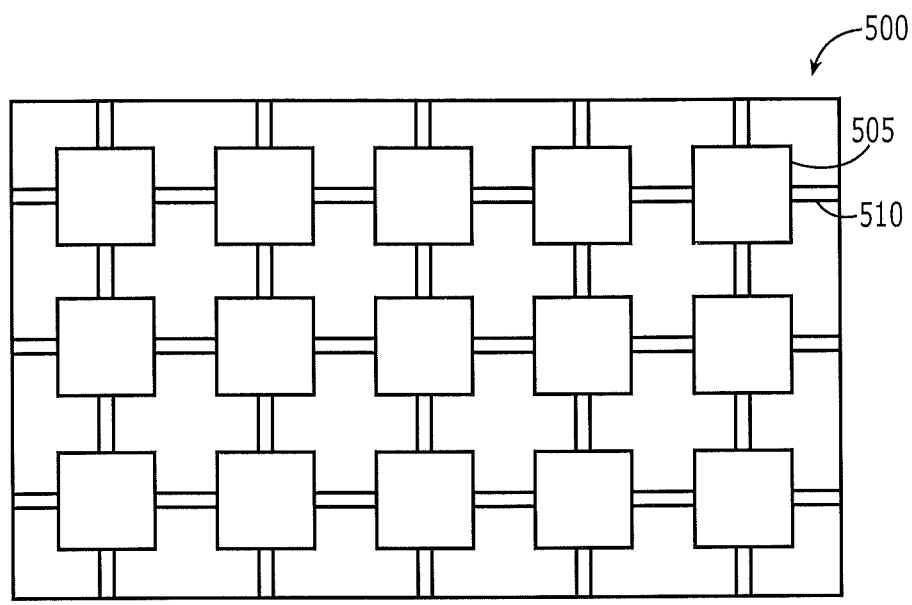
FIG. 14 is a plan view of an array of leadframe blanks in some embodiments according to the invention.

FIG. 14 is a schematic plan view illustrating an array of leadframe structures 505 attached via tabs 510 in some embodiments according to the invention. It will be understood the array of leadframe structures 505 can be formed from a single sheet of metal, such as copper, which is stamped to create the patterns shown. It will be further understood, when the leadframe structures 505 are applied to the underlying LTCC material 200, the tabs 510 as well as other features within the individual leadframe structures 505 can be removed so that only the portion of the leadframe structures 505 is applied to the LTCC material 200.

Figure 15A:
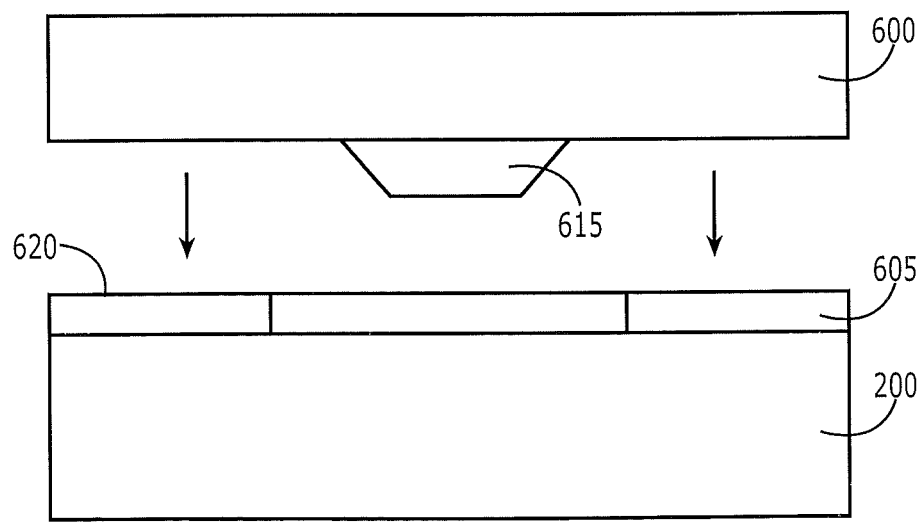
FIGS. 15A & 15B are cross sectional views illustrating the application of a leadframe to a co-fired ceramic material that is co-fired with the leadframe in some embodiments according to the invention.

FIGS. 15A & 16B are cross sectional views illustrating the formation of leadframe structures with LTCC materials in some embodiments according to the invention. According to FIG. 15A, a leadframe structure 605 can be placed onto the LTCC material 200. It will be understood the leadframe structure 605 can be placed on the LTCC material 200 while still connected to the array of leadframe structures 500 (i.e., while still connected to the other leadframe structures 505 by the tabs 510).

As further shown in FIG. 15A a press 600 including a protrusion 615 can be brought into contact with the leadframe structure 605. Accordingly, the leadframe structure 605 can be applied to the underlying LTCC material 200 by the press 600. As described herein, the LTCC material 200 can be in a malleable form so that when the protrusion 615 is brought into contact with the leadframe structure 605, the leadframe structure 605 is detached from the frame shown in FIG. 5 and is further shaped, for example, to provide a base in which the LED 190 may be situated. Further, the underlying LTCC material 200 is deformed to accommodate the protrusion 615 as well as the portion of the leadframe structure 605 contacted by the protrusion 615. In still further embodiments according to the invention, the surface of the leadframe structure 100 which faces the upper surface of the LTCC material 200 can be roughened to promote adhesion between the leadframe structure 100 and the underlying LTCC material 200 during application thereof.

Figure 15B:
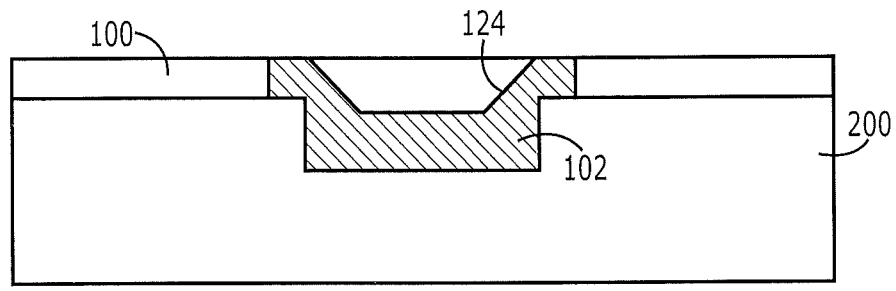
Figure 16:
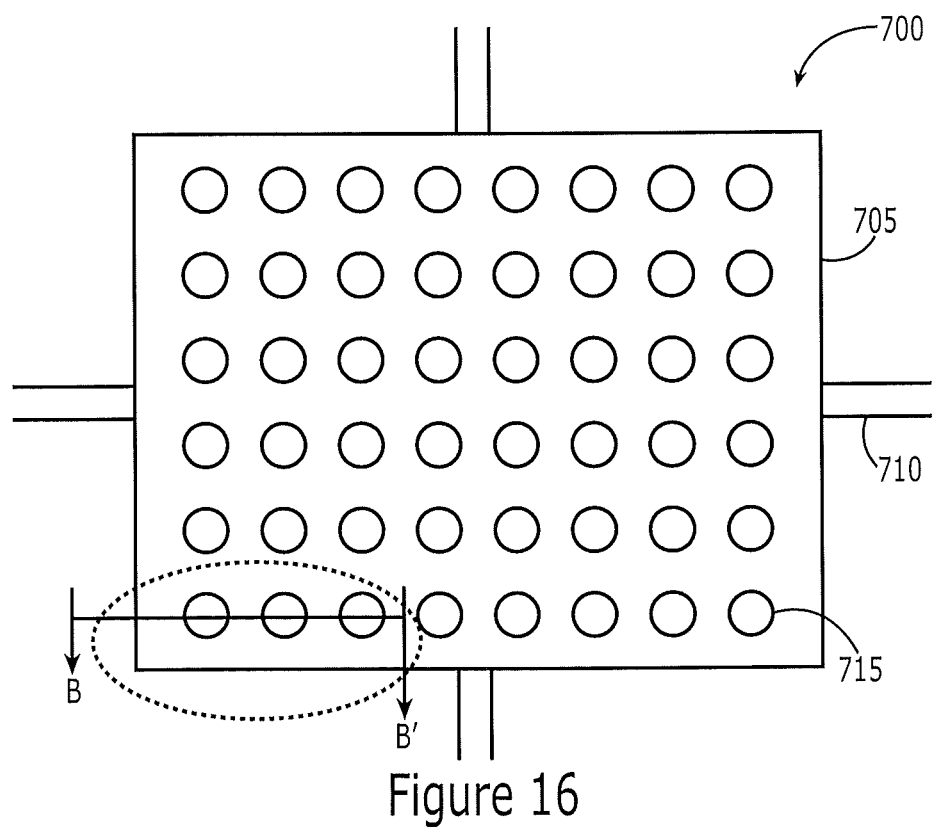
FIG. 16 is a plan view illustrating a leadframe having been punched-through during application of the leadframe to a co-fired ceramic material co-fired with the leadframe in some embodiments according to the invention.

According to FIG. 15B, the leadframe structure 605 shown in FIG. 15A has been pressed into the upper surface of the LTCC material 200 in the shape of the cavity 124. Further, the LTCC material 200 and the leadframe structure 100 are co-fired with one another so that the constituent elements therein at the junction between the leadframe structure 100 and the LTCC material 200 mix to become integral with one another so that the transfer of heat may be promoted away from the LED through the leadframe structure 100 and into the LTCC material 200. It will be understood FIGS. 15A & 15B provide a generic description of a process by which the leadframe structure can be applied to the underlying LTCC material.

Figure 17:
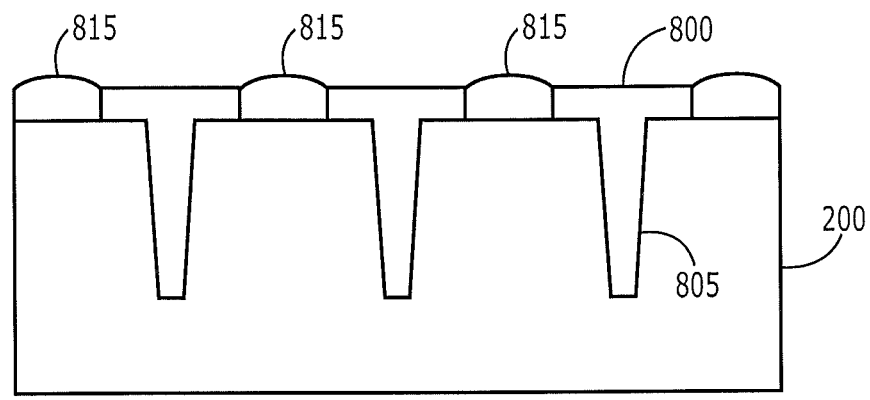
FIG. 17 is a cross sectional view of leadframe portions which are recessed within a co-fired with the co-fired ceramic material as shown in FIG. 16 in some embodiments according to the invention.

FIGS. 16-20 illustrate some alternative embodiments in which the leadframe structure can be applied to the underlying LTCC material. In particular, according to FIG. 16, a leadframe structure 705 includes punched through portions 715 which have been produced by puncturing the leadframe structure 705. As shown in FIG. 17, the punched through portions 800 of the leadframe structure 705 have been recessed into the LTCC material 200.

The co-firing of the leadframe structure 705 and the LTCC material 200, can cause constituent elements that comprise the leadframe structure 100 and the LTCC material 200 to mix with one another at, for example, a junction thereof so that the leadframe structure 100 and the LTCC material 200 become integrated. The punched through portions 800 can promote additional heat transfer from the leadframe structure into the LTCC material 200 given that those punched through portions 800 are recessed beneath the upper surface of the LTCC material 200.

As further shown in FIG. 17, the punched through portions 800 can be spaced apart from one another by a distance which is sufficient to compensate for a difference in the temperature co-efficient of the LTCC material 200 and the leadframe structure 705. In particular, the LTCC material and the leadframe structure 705 are formed of different materials, so that each of the materials will have respective temperature co-efficient which will describe different degrees of expansion during heating. Accordingly, the spacing between the punched through portions 800 can compensate for the greater thermal co-efficient of the metal used to form the leadframe structure 705 compared to the relatively lower thermal co-efficient of the LTCC material 200. Therefore, the distance between the spaced apart punched through portions 800 can provide expansion joints therebetween so that when the leadframe structure expands more than the LTCC material 200 during heating, the two materials may remain as one and be less likely to separate. Furthermore, the spacing between the punched through portions 800 can be filled with a conductive ink 815 which can provide electrical conductivity between the punched through portions 800 of the leadframe structure 705 as well as still compensate for the greater expansion of the punched through portions 800. It will be understood that the LED 190 can therefore be positioned on the punched through portions of the leadframe structure 705 to provide for the LED package.

In still further embodiments according to the invention, the pattern of the punched through portions 715 can be configured to further compensate for the difference in the temperature co-efficients. For example, the punched through portion 715 may be variantly located within the leadframe structure 705.

Figure 18:
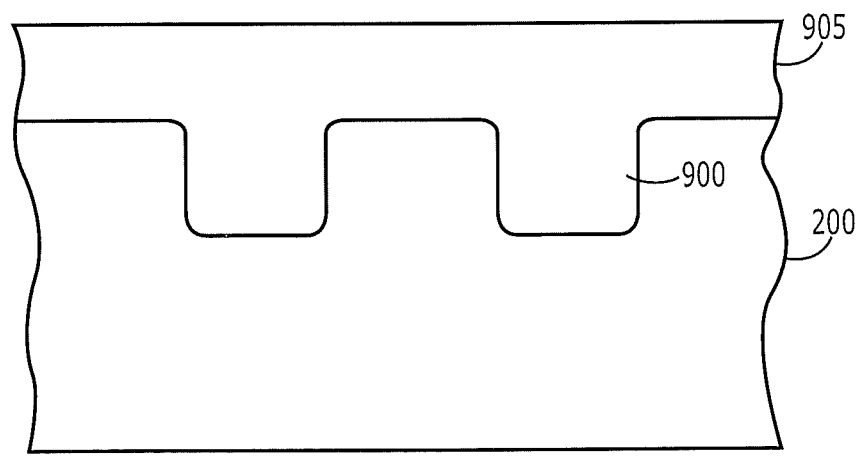
FIG. 18 is a cross sectional view of a leadframe including protrusions extending into an upper surface of a co-fired ceramic material in some embodiments according to the invention.

FIG. 18 is a cross sectional view of a leadframe structure 905 including protrusions 900 which are pressed into the LTCC material 200 while in a relatively softened state. In particular, the leadframe structure 905 can be formed to include the protrusions 900 on a surface thereof which faces the LTCC material 200. The leadframe structure 905 is then applied to the upper surface of the LTCC material so that the protruding portions 900 extend beneath the upper surface of the LTCC material 200 and are recessed within the LTCC material 200. Accordingly, the protruding portions 900 can further promote the transfer of heat away from the LED 190.

The co-firing of the leadframe structure 905 and the LTCC material 200, can cause constituent elements that comprise the leadframe structure 905 and the LTCC material 200 to mix with one another at, for example, a junction thereof so that the leadframe structure 905 and the LTCC material 200 become integrated.

Figure 19:
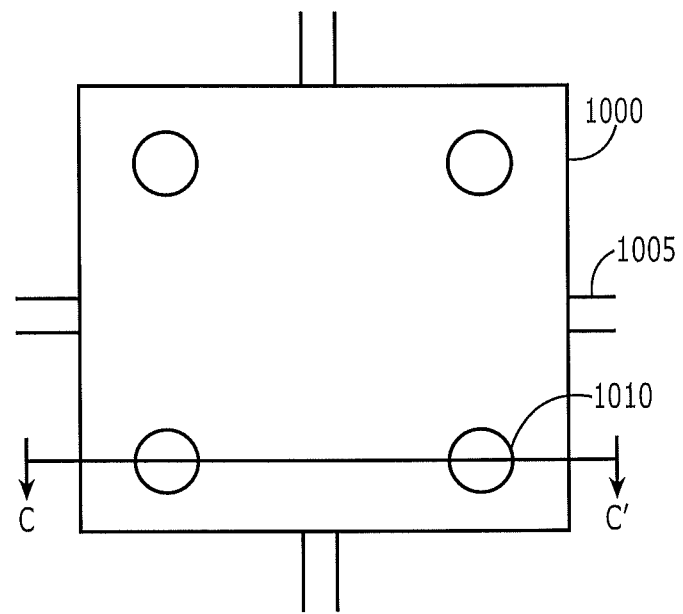
FIG. 19 is a plan view of a leadframe including pressed portions thereof in some embodiments according to the invention.

FIG. 19 is a plan view which illustrates a schematic representation of a leadframe structure 1000 that can be part of an array of structures connected by tabs 1005 in some embodiments according to the invention. As further shown in FIG. 19, pressed un-punctured portions 1010 are formed in the leadframe structure 1000. For example, the pressed un-punctured portions 1010 can be formed while separating the leadframe structures 1000 from the array shown in FIG. 5 and while also applying the leadframe structure 1000 to the upper surface of the LTCC material 200. The co-firing of the leadframe structure 1000 and the LTCC material 200, can cause constituent elements that comprise the leadframe structure 1000 and the LTCC material 200 to mix with one another at, for example, a junction thereof so that the leadframe structure 1000 and the LTCC material 200 become integrated.

Figure 20:
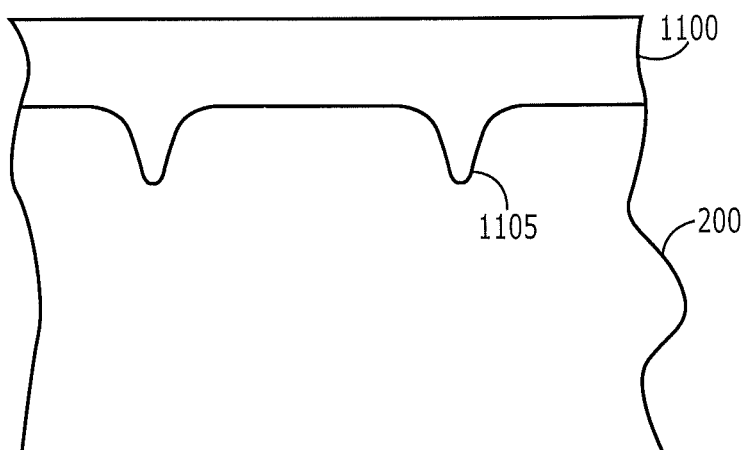
FIG. 20 is a cross sectional view of a leadframe including pressed portions which are non-punctured and extend beneath an upper surface of a co-fired ceramic material, co-fired with the leadframe in some embodiments according to the invention.

FIG. 20 is a cross-sectional view which illustrates the pressed un-punctured portions 1010 applied to the LTCC material 200 so that the pressed un-punctured portions of the leadframe structure 1000 are pressed into the surface of the LTCC material, although the leadframe structure remains a continuous material after application to the LTCC material 200. In some embodiments according to the invention, a slurry or wet paste of the ceramic material can provide the LTCC material 200. Accordingly, the slurry or wet paste of the ceramic material could be provided to a fixture, mold, or other structure to allow co-firing with the leadframe structure 100 to provide improved integration of the materials with one another.

As described herein, various embodiments according to the invention can provide a structure for mounting an LED thereon which can include a leadframe on a ceramic material, where the leadframe structure includes a portion that allows the ceramic material and the leadframe structure to be integrated with one another. For example, in some embodiments according to the invention, an electrically conductive via in the leadframe structure extends into the ceramic material to provide the integration.

In some embodiments according to the invention, the leadframe structure extends on both an upper surface and on an opposing lower surface of the ceramic material to provide the integration. In still further embodiments according to the invention, the integration can be provided by using a co-fired ceramic as the ceramic material which is co-fired with the leadframe structure so that, for example, the constituent materials of the leadframe structure and the co-fired ceramic can mix with one another. In some according to the invention, the ceramic material can be a low temperature co-fired ceramic (LTCC) material.

In the drawings and specification, there have been disclosed embodiments of the invention and, although specific terms are employed, they are used in a generic and descriptive sense only and not for purposes of limitation, the scope of the invention being set forth in the following claims.

What is claimed:

1. A structure for mounting an LED thereon, comprising:
a ceramic material; and
a leadframe structure, on the ceramic material, the leadframe structure including a portion thereof that integrates the leadframe structure with the ceramic material.

2. A structure according to claim 1 wherein the portion of the leadframe structure that integrates the leadframe structure with the ceramic material comprises an electrically conductive via that extends in the leadframe structure into the ceramic material.

3. A structure according to claim 1 wherein the ceramic material comprises a co-fired ceramic material and wherein the portion of the leadframe structure that integrates the leadframe structure with the ceramic material is co-fired with the ceramic material.

4. A structure according to claim 1 wherein the portion of the leadframe structure that integrates the leadframe structure with the ceramic material comprises a lead of the leadframe structure that continuously extends on an upper surface and on a lower opposing surface of the ceramic material.

5. A structure according to claim 1 wherein the ceramic material comprises a low-temperature co-fired ceramic (LTCC) material and wherein the portion of the leadframe structure that integrates the leadframe structure with the LTCC material is co-fired with the LTCC material.

6. A structure for mounting an LED thereon, comprising:
a ceramic material; and
a leadframe structure, on the ceramic material; and
an electrically conductive via that extends in the leadframe structure into the ceramic material to integrate the leadframe structure with the ceramic material.

7. A structure according to claim 6 wherein the leadframe structure comprises a first leadframe structure on a first surface of the ceramic material, the structure further comprising:
an LED on the first leadframe structure; and
a second leadframe structure on a second surface of the ceramic material opposite the first surface.

8. A structure according to claim 7 wherein the electrically conductive via further extends through the ceramic material to the second leadframe structure.

9. A structure according to claim 6, wherein the leadframe structure is on a first surface of the ceramic material, the structure further comprising:
an LED on a second surface of the ceramic material that is opposite the first surface.

10. A structure according to claim 6 wherein the ceramic material comprises a first ceramic material on a first surface of the leadframe structure, the structure further comprising:
an LED on the first ceramic material; and
a second ceramic material on a second surface of the leadframe structure opposite the first surface.

11. A structure according to claim 10 wherein the electrically conductive via further extends in the first ceramic material through the leadframe structure into the second ceramic material.

12. A structure for mounting an LED thereon, comprising:
a ceramic material; and
a leadframe structure, on the ceramic material, including a lead of the leadframe structure that continuously extends on first and second opposing surfaces of the ceramic material.

13. A structure according to claim 12 further comprising:
an LED on a central portion of the first side of the leadframe structure.

14. A Light Emitting diode (LED) comprising:
a low-temperature co-fired ceramic material;
a leadframe structure, co-fired with the low-temperature co-fired ceramic material; and
an LED chip on the leadframe structure including a wire bonded to the leadframe.

15. An LED according to claim 14 wherein the LED chip is connected to the leadframe structure without a submount structure therebetween.

16. An LED according to claim 15 wherein the LED chip is housed in an encapsulate without inclusion of a plastic package body connected to the leadframe structure.

* * * * *